(12) United States Patent
Pilcher

(10) Patent No.: US 7,046,739 B2
(45) Date of Patent: May 16, 2006

(54) PRE-DISTORTION OF INPUT SIGNALS TO FORM CONSTANT ENVELOPE SIGNAL OUTPUTS

(75) Inventor: Michael E. Pilcher, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 887 days.

(21) Appl. No.: 09/859,497

(22) Filed: May 18, 2001

(65) Prior Publication Data

US 2002/0172296 A1    Nov. 21, 2002

Related U.S. Application Data

(60) Provisional application No. 60/270,173, filed on Feb. 22, 2001.

(51) Int. Cl.
*H04K 1/02* (2006.01)
*H04L 27/36* (2006.01)

(52) U.S. Cl. .......................... 375/296; 376/298
(58) Field of Classification Search .......... 375/296, 375/298, 297, 295; 455/126
See application file for complete search history.

(56) References Cited

U.S. PATENT DOCUMENTS

| | | | |
|---|---|---|---|
| 4,270,223 A * | 5/1981 | Marston | 455/305 |
| 5,990,750 A | 11/1999 | Katz | |
| 6,125,103 A | 9/2000 | Bauml et al. | |
| 6,255,906 B1 * | 7/2001 | Eidson et al. | 330/124 R |
| 6,307,892 B1 * | 10/2001 | Jones et al. | 375/296 |
| 6,335,951 B1 * | 1/2002 | Cangiani et al. | 375/298 |
| 6,445,749 B1 * | 9/2002 | Feher | 375/298 |

* cited by examiner

*Primary Examiner*—Stephen Chin
*Assistant Examiner*—Cicely Ware
(74) *Attorney, Agent, or Firm*—Oliff & Berridge, PLC (57) ABSTRACT

A plurality of input signals are pre-distorted for combination into a first combined signal having a constant envelop. The input signals are combined into a second combined signal, and a similarity between each of the input signals and the second combined signal is measured. Ones of the input signals are selected and attenuated based on the similarity measurement. The attenuated input signals and non-attenuated signals are output for combination to form the first combined signal.

8 Claims, 12 Drawing Sheets

PRE-DISTORTION OF INPUT SIGNALS TO FORM CONSTANT ENVELOPE SIGNAL OUTPUTS

This non-provisional application claims the benefit of U.S. Provisional Application No. 60/270,173 entitled "Constant Envelope Forcing Algorithm Using Correlation-Based Attenuation For Digital Pre-Distortion" which was filed on Feb. 22, 2001, and is hereby incorporated by reference in its entirety. The Applicant of the provisional application is Michael Pilcher.

BACKGROUND OF THE INVENTION

1. Field of Invention

This invention relates to constant envelope for output signals.

2. Description of Related Art

Linearity may be a critical parameter in power amplifiers and mixers. For example, class A power amplifiers are used in communications systems because they are highly linear. Many manufacturers incorporate additional feed-forward paths to achieve linearity in power amplifiers. However, due to possible peaks in signal values, linearity in components such as power amplifiers can be obtained only if requirements of resources such as power supply voltages are maintained at a sufficiently high level to account for the signal peaks. Thus, the signal peaks force higher resource requirements which result in higher equipment costs. Accordingly, there is a need for new technology that can reduce resource requirements in components like power amplifiers and mixers without linearity degradation.

SUMMARY OF THE INVENTION

An apparatus and method is provided for controlling an envelope of combined signals to within a prescribed limit. When multiple input signals are combined into a single output signal for transmission, for example, various ones of the input signals may be correlated for short time intervals causing signal power peaks. The peaks in the combined signal may be controlled by attenuating (pre-distorting) contributing input signals. All the input signals are combined to form a first summary signal. A similarity measurement is made between each of the input signals and the first summary signal, and an attenuation value for each input signal is generated based on the similarity measurement. The input signals are then attenuated by corresponding attenuation values prior to combining the input signals into a second combined signal for output. In this way, the magnitude of the peaks in the second combined signal are reduced to within the envelope, thus permitting lower component resource requirements.

BRIEF DESCRIPTION OF THE DRAWINGS

This invention is described in detail with regard to the following figures, in which like elements are referred to with like numerals, and in which.

DETAILED DESCRIPTION OF PREFERRED EMBODIMENTS

There are many situations where input signals are combined into a single combined signal. For example, in communications, it is common to modulate one or more input signals onto carriers for transmission. When a carrier signal (a combined signal) at an intermediate frequency (IF) is converted to radio frequency and amplified, the components that perform these operations must process the combined signal faithfully, which translates to linearity requirements. Components are usually linear over a certain dynamic range based on parameters such as power supply voltage, etc. When various ones of the input signals are correlated over even a short time interval, the instantaneous magnitude of the combined signal may reach very high levels, forming peaks. To accommodate these peaks and to maintain linearity, a magnitude of the supply voltage, for example, must be set at a high enough level to ensure faithful processing of the combined signal. However, if the peaks are reduced, the requirement on the supply voltage (or other parameters such as supply current) may be correspondingly reduced resulting in overall cost savings.

The peaks in the combined signal may be reduced by attenuating amplitudes of the input signals. Input signals that contribute to the peaks may be selected by measuring a similarity (e.g., cross correlation) between each of the input signals and the combined signal. When the similarity measurement of an input signal exceeds a threshold, for example, an attenuation value for the input signal may be generated based on the results of the similarity measurement. By attenuating the amplitudes of all the input signals whose similarity measurement exceeds the threshold, the peaks in the combined signal may be reduced to within a predetermined value (e.g., an envelope). The attenuated input signals may then be combined with the other non-attenuated input signals to form a new combined signal that fits within the desired envelope. Thus, a dynamic range requirement on the components that process the new combined signal is reduced to be less than that required to process the original combined signal, which, in turn, results in a reduction of requirements on other supporting devices such as power supplies, etc.

While this disclosure discusses a pre-distortion technique using a communications system as an example, the technique may be applied to any situation where peaks of a combined signal need to be controlled. For example, if noise emitted from a bundle of twisted pairs is required to be below a certain level to reduce cross talk, for example, the signals of the twisted pairs may be first combined into a combined signal, and a similarity between a signal of each of the twisted pairs and the combined signal may be measured. Then, the signals of the twisted pairs may be attenuated based on the similarity measurement before driving the twisted pairs. In this way, noise emitted by the bundle may be limited to be less than a predetermined value.

Figure 1:
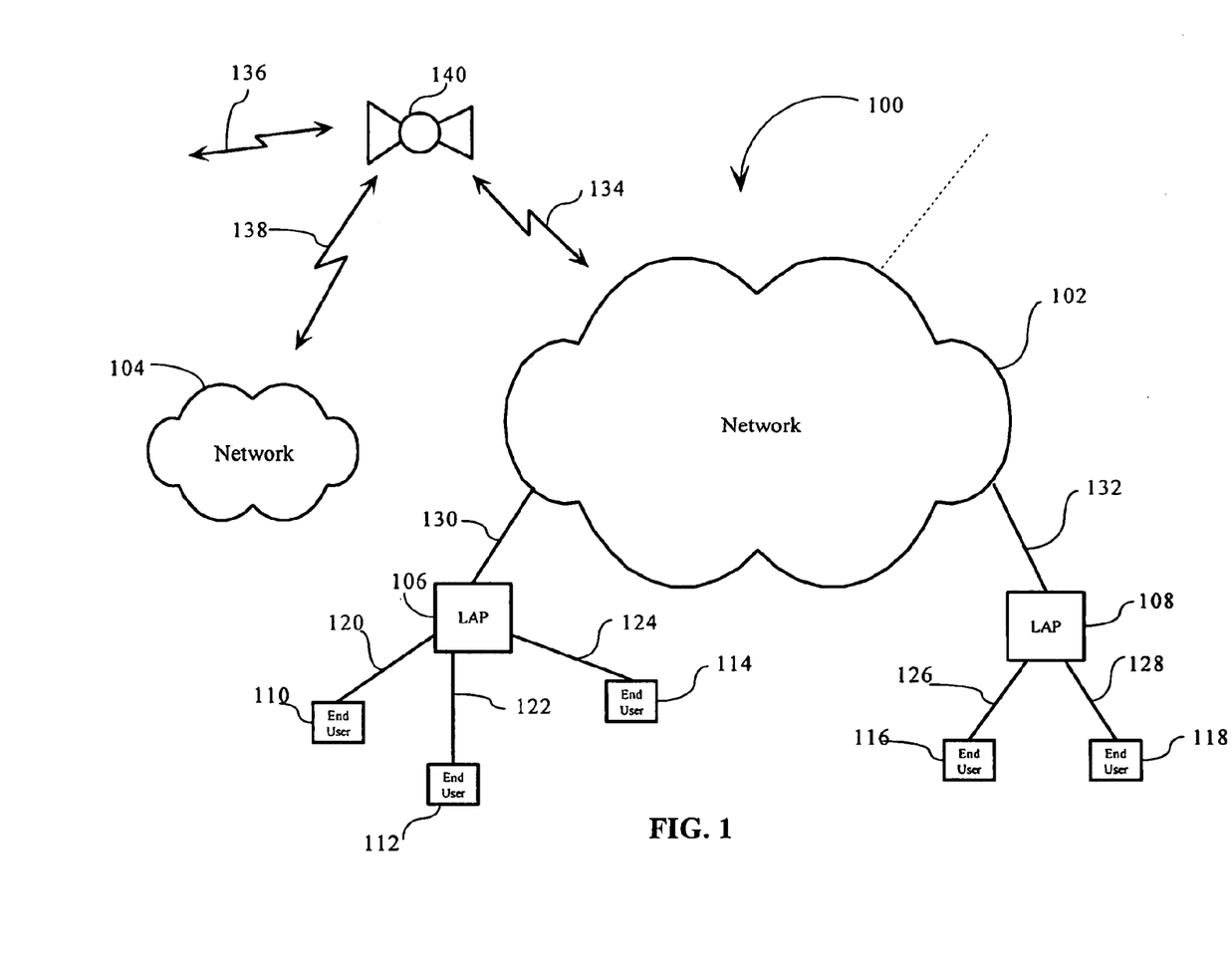
FIG. 1 is an exemplary block diagram of one system where multiple input signals are combined into a single output signal for transmission.

FIG. 1 is an exemplary block diagram of a communications system 100 that includes one or more networks 102–104, local access providers (LAP) 106–108, end-users 110–118 and wireless communication devices such as one or more satellites represented by satellite 140. LAPs 106–108 may be central offices, Internet service providers, mobile telephone switching office, etc. The end-users 110–114 may be any device capable of wired or wireless communication such as telephone stations, cell phones, pagers, facsimile machines, computers, etc. The networks 102–104 may include diverse systems such as wireless phone systems, cable systems, television systems, Internet, etc. encompassing both switched and data networks.

Communication signals transmitted by end-users 110–114, for example, are routed to respective destination addresses by the LAP 106 via the networks 102–104 and the satellite 140 if required. In order to maximize usage of available communication links, communication signals that are destined to the same geographic area may be grouped together into a single combined signal. The combined signal may be transmitted to a distribution site that serves the geographic area. Once received, the combined signal is split back into the original communication signals and distributed (which may include a new combined signal) to the respective destinations. This combining and splitting process may be performed anywhere in the communications system 100 (even between intermediate destinations within the networks 102–104 and the satellite 140) so that efficient utilization of the communication links such as links 130–138 may be achieved.

Figure 2:
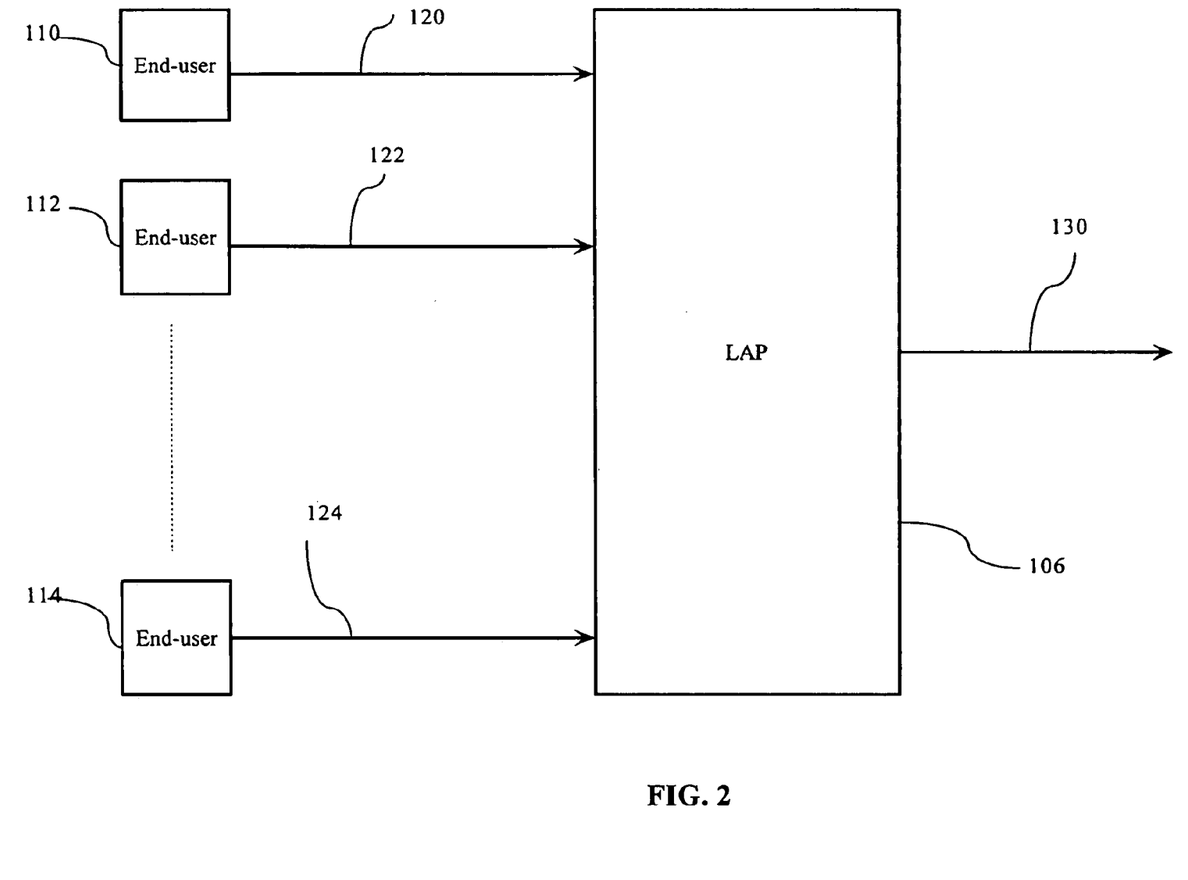
FIG. 2 is an exemplary block diagram of a local access provider (LAP) combining input signals of end-users into a single output signal for transmission.

As an example, FIG. 2 shows a block diagram of end-users 110–114 and LAP 106 that combines the communication signals output by the end-users 110–114. This assumes that communication signals from the end-users 110–114 are all to be transmitted to the same geographic area. The LAP 106 may modulate each of the communication signals onto separate carriers and then combine the modulated carriers into a single combined signal for transmission. Thus, for purposes of this example, the communication signals that are generated by the end-users 110–114 are input into the LAP 106 via links 120–124, and the LAP 106 combines the communication signals into a combined signal and outputs the combined signal on link 130. As indicated by the dashed line, any number of end-users 110–114 may be included. Three end-users 110–114 are discussed here as an example for convenience. The general configuration shown in FIG. 2 may be applied anywhere in the communications system 100 (or any other types of systems) where multiple input signals are combined into a single combined signal.

Figure 3:
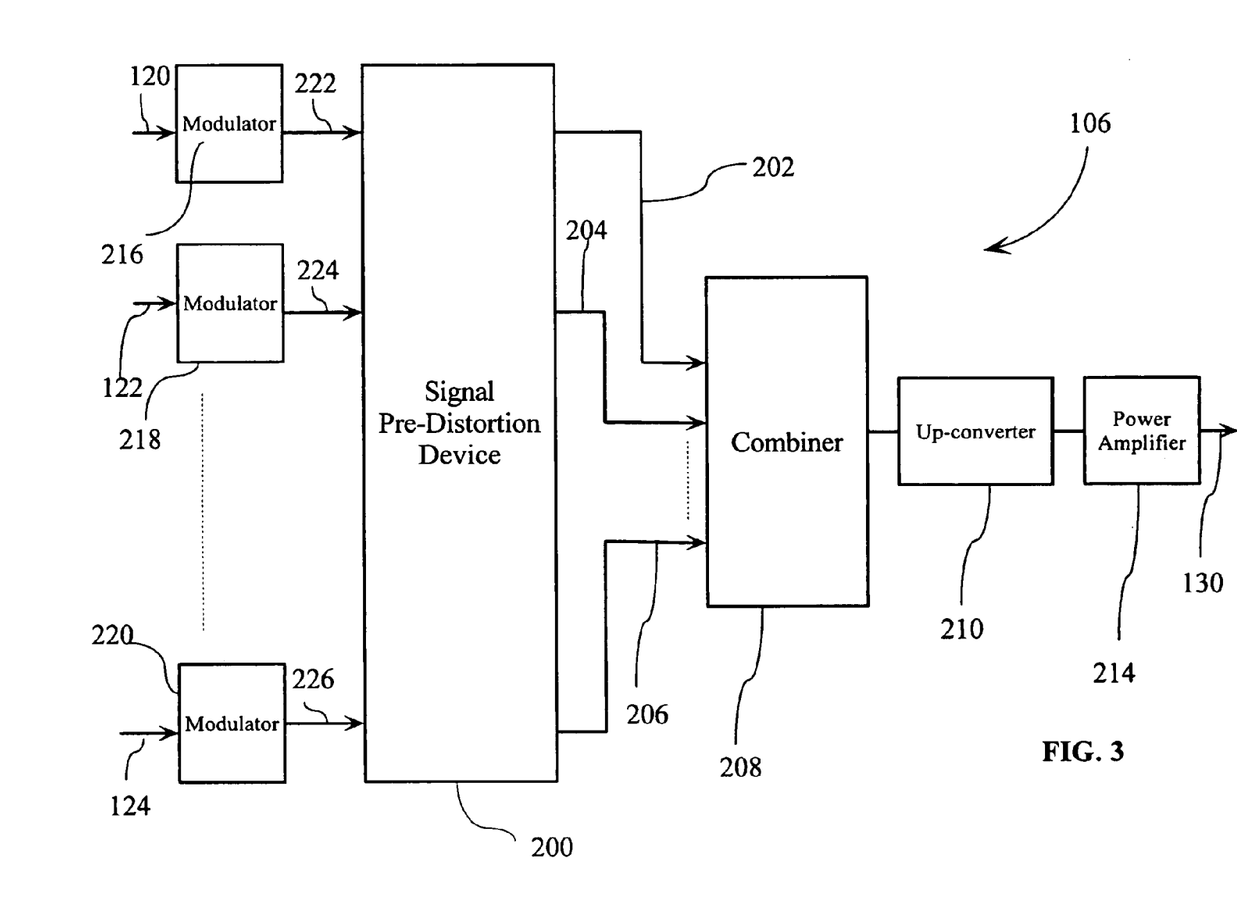
FIG. 3 is an exemplary block diagram of the LAP that includes a pre-distortion device.

FIG. 3 shows a portion of the LAP 106 that combines the communication signals received from the links 120–124. The received communication signals may be each modulated by modulators 216–220 to respective intermediate frequency (IF) carriers, for example. The modulated IF carriers are input to a signal pre-distortion device 200 via links 222–226. The signal pre-distortion device 200 outputs attenuated modulated IF carriers via links 202–206 to a combiner 208 to generate a combined signal. The combined signal may then be up-converted by an up-converter 210 and amplified by a power amplifier 214 before output via link 130 for transmission, for example. The signal pre-distortion device 200 forces the combined signal output by the combiner 208 to be within a constant envelope by attenuating selected ones of the modulated IF carriers input via the links 222–226.

Figure 4:
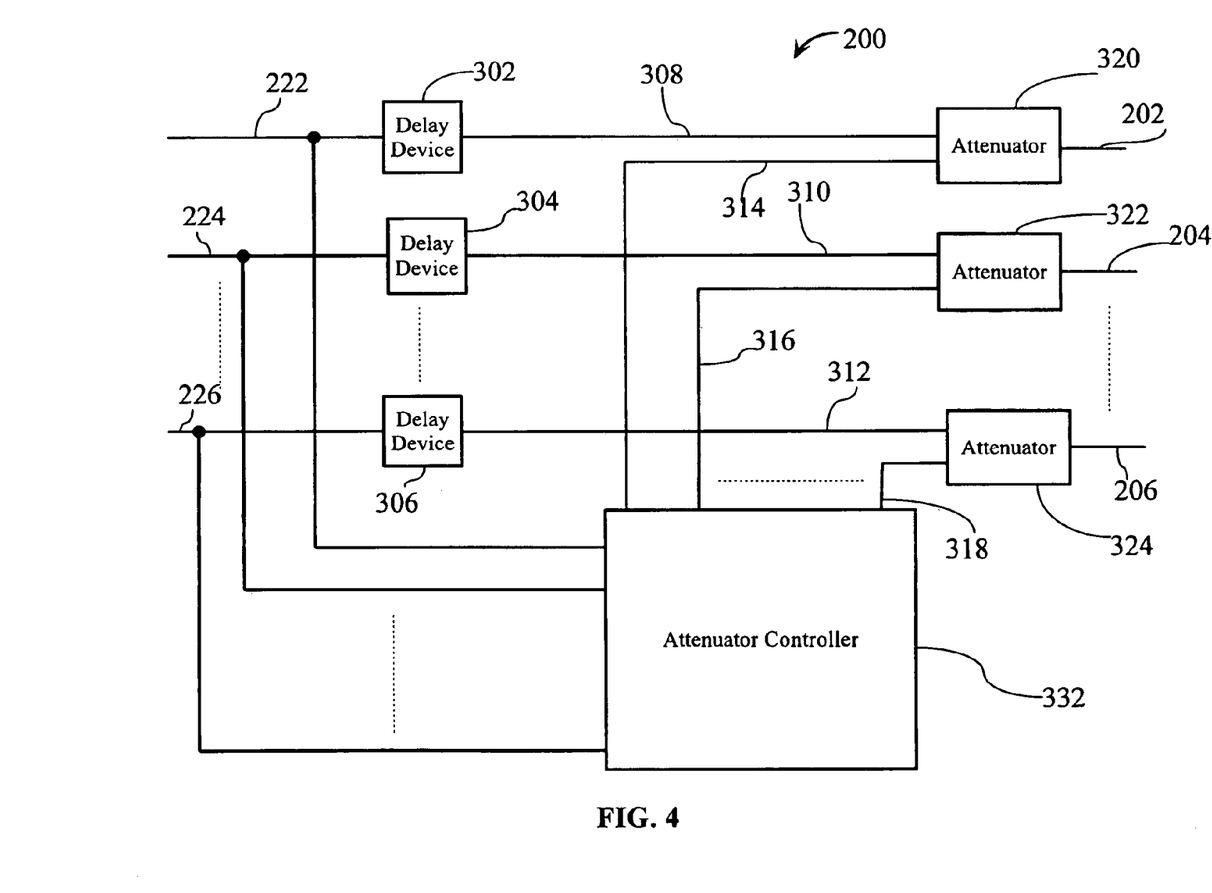
FIG. 4 is a detailed exemplary block diagram of a pre-distortion device.

The signal pre-distortion device 200 is shown in greater detail in FIG. 4. Input signals (the modulated IF carriers) are received via links 222–226 and distributed to delay devices 302–306 and an attenuator controller 332. The attenuator controller 332 generates attenuation values which are applied by attenuators 320–330 to the input signals after being delayed by the delay devices 302–306. The delay devices 302–306 account for time that may be required by the attenuator controller 332 to generate the attenuation values so that the attenuation values may be synchronized with the input signals.

Figure 5:
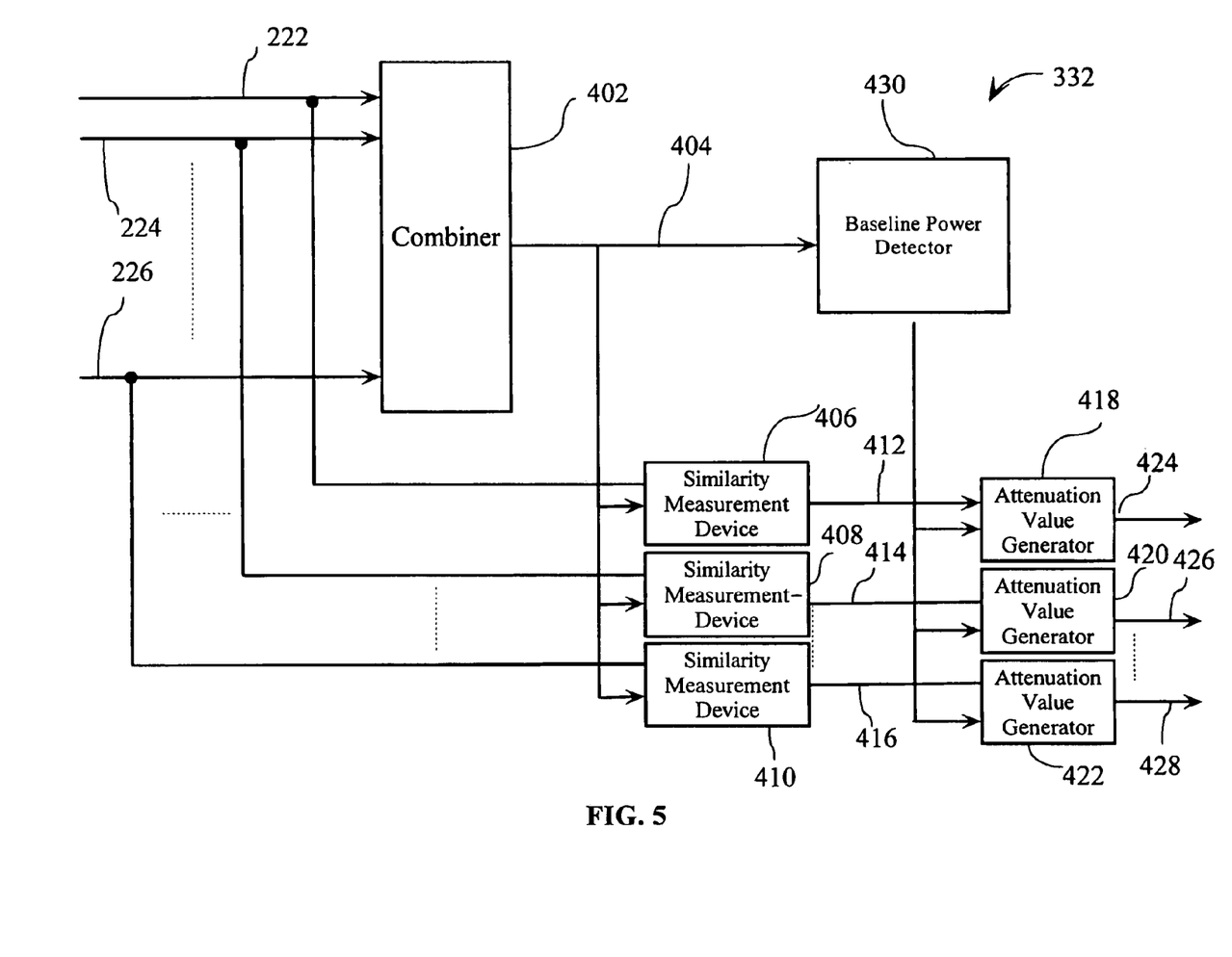
FIG. 5 is an exemplary block diagram of an attenuator controller.

FIG. 5 shows the attenuator controller 332 in greater detail. The input signals are received by a combiner 402 and similarity measurement devices 406–410. The combiner 402 combines the input signals to simulate/emulate the process performed by the combiner 208. The combiner 402 may be identical to the combiner 208, but need not be identical if accurate simulation/emulation of the combiner 208 output may be obtained using less resources. Thus, two combined signals are generated, a first combined signal generated by the combiner 208 and a second combined signal generated by the combiner 402.

One of the purposes of the combiner 402 is to generate the second combined signal that predicts one or more time intervals where the first combined signal may exceed a predetermined value. The predetermined value represents the constant envelop (i.e., a maximum not to exceed value). Once the time intervals are identified, the input signals are processed by the similarity measurement devices 406–410 to generate a comparison value for each of the input signals. The comparison values are used by attenuation value generators 418–422 together with an input selection parameter generated by an input selection parameter generator 430 to select ones of the input signals that are most likely contributors to peaks in the first combined signal. A controller may also be included to coordinate the processes of the attenuator controller 332.

The processes of the pre-distortion device 200 may be performed using either analog or digital techniques. For analog implementations, each of the functions described above may be implemented by a combination of analog components. For example, the comparison values may be generated by an analog mixer and filter, and the combiner 402 may be implemented by an operational amplifier configured as a unity gain summer. For ease of discussion, the following describes the processes performed by the pre-distortion device 200 using digital techniques.

Figure 6:
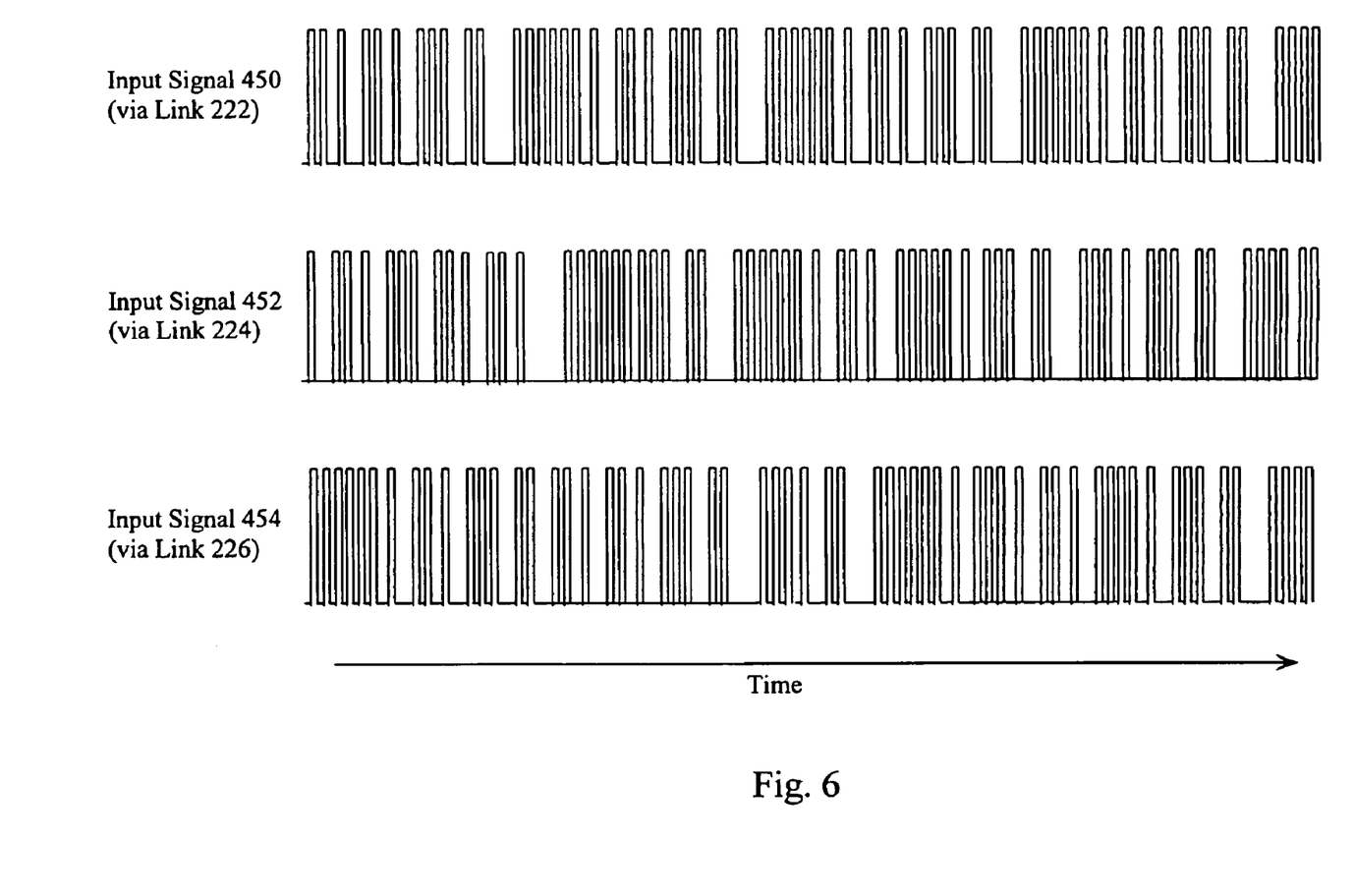
FIG. 6 is an exemplary signal diagram of various input signals received by the pre-distortion device of FIG. 4.
Figure 7:
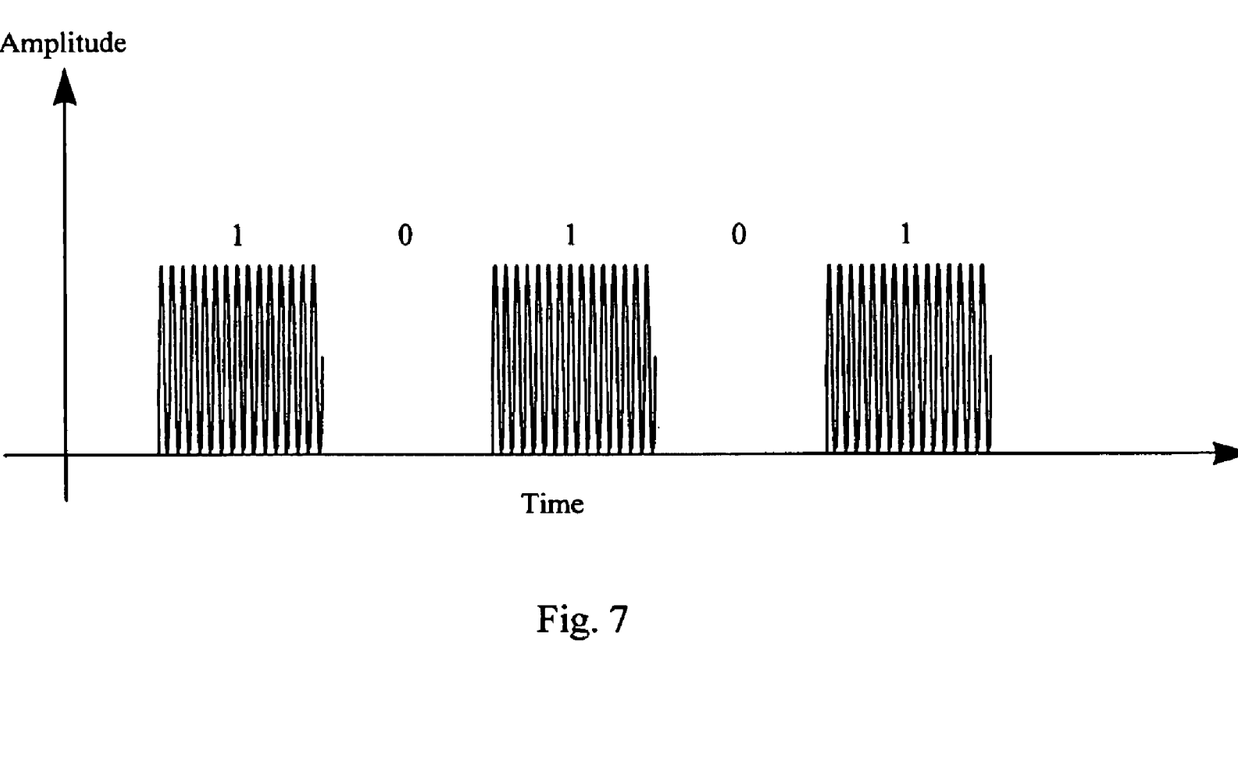
FIG. 7 is an exemplary signal diagram of a base-band input signal.

FIG. 6 shows an example of three input signals 450–454 received via links 222–226. The input signals 450–454 may be base-band digital signals which are 1s and 0s modulated onto the IF carriers. FIG. 7 shows an example of a base-band input signal. During a time (or duration) when the input signal is a binary 1, the carrier signal is output, and during a time when the input signal is a binary 0, the carrier signal is not output. Thus, the base-band input signal shown in FIG. 7 has a value of 10101. For simplicity, the base-band signals are represented by empty rectangles (or pulses) as in FIG. 6.

Figure 8:
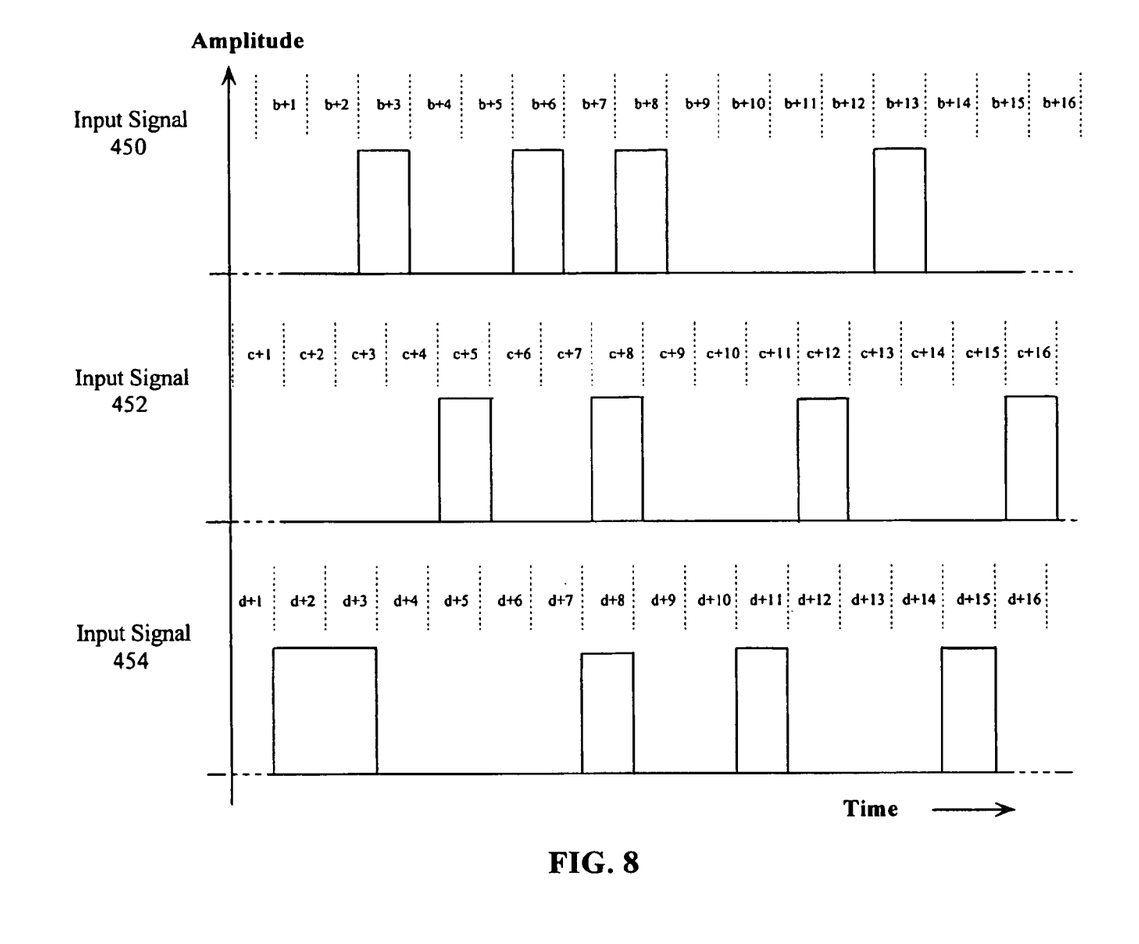
FIG. 8 is an exemplary expanded signal diagram of data for the input signals of FIG. 6.

FIG. 8 shows an example of data for a portion of a window for input signals 450–454 where time extends along the horizontal axis. As shown, time is divided into bit durations so that a 1 bit is a high level that lasts for one bit duration and a 0 is a low level lasting for one bit duration. The bits of the input signals 450–454 may be referred to by numbers such as b+1, b+2, . . . for input signal 450; c+1, . . . c+2, . . . for input signal 452; and d+1, d+2, . . . for input signal 454. The time axis increases from left to right so that bits to the left occur earlier than bits to the right. Thus, bits at b+1, c+1 and d+1 are received before bits at b+2, c+2 and d+2. Accordingly, data for the input signal 450 is 0010 0101 0000 1000 assuming that the left bit is transmitted first. Similarly, the data for the input signal 452 is 0000 1001 0001 0001, and the data for the input signals 454 is 0110 0001 0010 0010.

Figure 9:
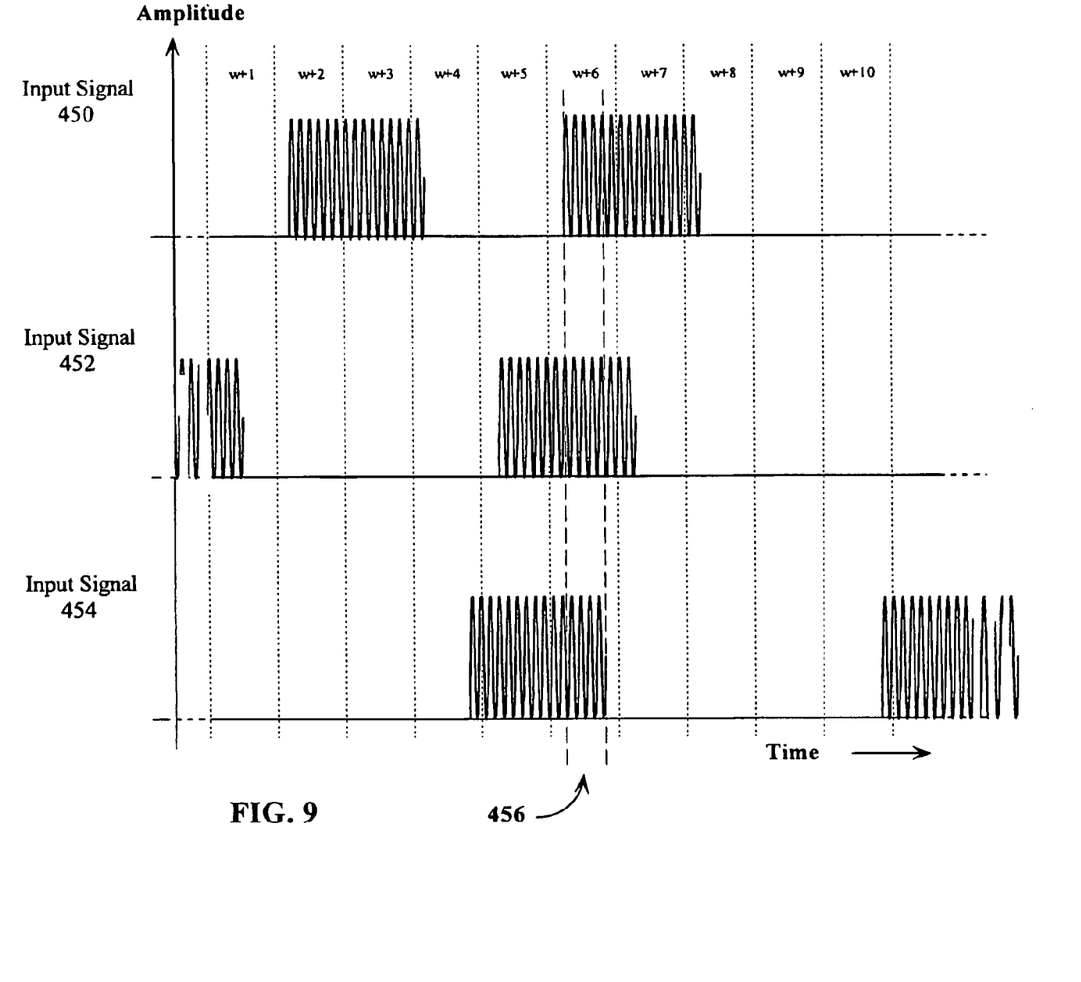
FIG. 9 is a detailed exemplary diagram of a portion of the signals shown in FIG. 8 divided into windows.

FIG. 9 shows a time interval extending between b+5 through b+9 in expanded detail. All the input signals 450–454 may be converted to digital values by an analog to digital (A/D) converter, for example, and the digital, values buffered in a memory as data (one byte per sample, for example). The pre-distortion device 200 may process the input signals 450–454 in time blocks or windows such as windows w+1, w+2, etc. shown in FIG. 9. The pre-distortion device 200 processes each window of data to obtain attenuation values and attenuate the unprocessed data of the same window for output to the combiner 208. In this way, the attenuation values are synchronized with the input signals 450–454 so that the appropriate attenuation values are applied to the proper window of input signals 450–454.

A width of the windows maybe wider than a period of the highest frequency IF carrier but smaller than the shortest bit duration. If the window widths are set smaller than the period of the highest frequency IF carrier, the amplitude adjustments will change too fast, thus spreading too much of the signal energy out of band. However, if the window widths are set to be larger than the shortest bit duration, then degradation of data reception maybe incurred because signal strength at the receiver may be undesirably reduced. However, if lower quality is acceptable, the window widths may be set to be greater than any of the bit durations (e.g., a window width of two bit durations). The exact size of the windows may be determined based on circumstances of a particular implementation such as an amount of memory available, an expected number of input signals that would require attenuation, the processing power that can be devoted to this process, etc.

While FIGS. 8 and 9 show the same bit durations for all the input signals 450–454, this need not be the case. Also, as shown, the bit durations for the input signals 450–454 may not be aligned (i.e., the input signals 450–454 are not synchronized.). Thus, depending on the exact circumstances that may occur, the magnitudes of the input signals 450–454 may constructively or destructively interact with each other when combined in the combiner 208.

For example, the input signals 450–454 are all 1s at b+8, c+8 and d+8 for a time interval 456. The input signals 450–454 for this short time interval 456 is expanded in FIG. 10 to illustrate how the input signals 450–454 may be combined to form a peak assuming that the combined signal 458 is a sum of the input signals 450–458. Other types of combining may also be used as long as amplitudes of the input signals 450–454 affect an amplitude of a combined signal 458.

Figure 10:
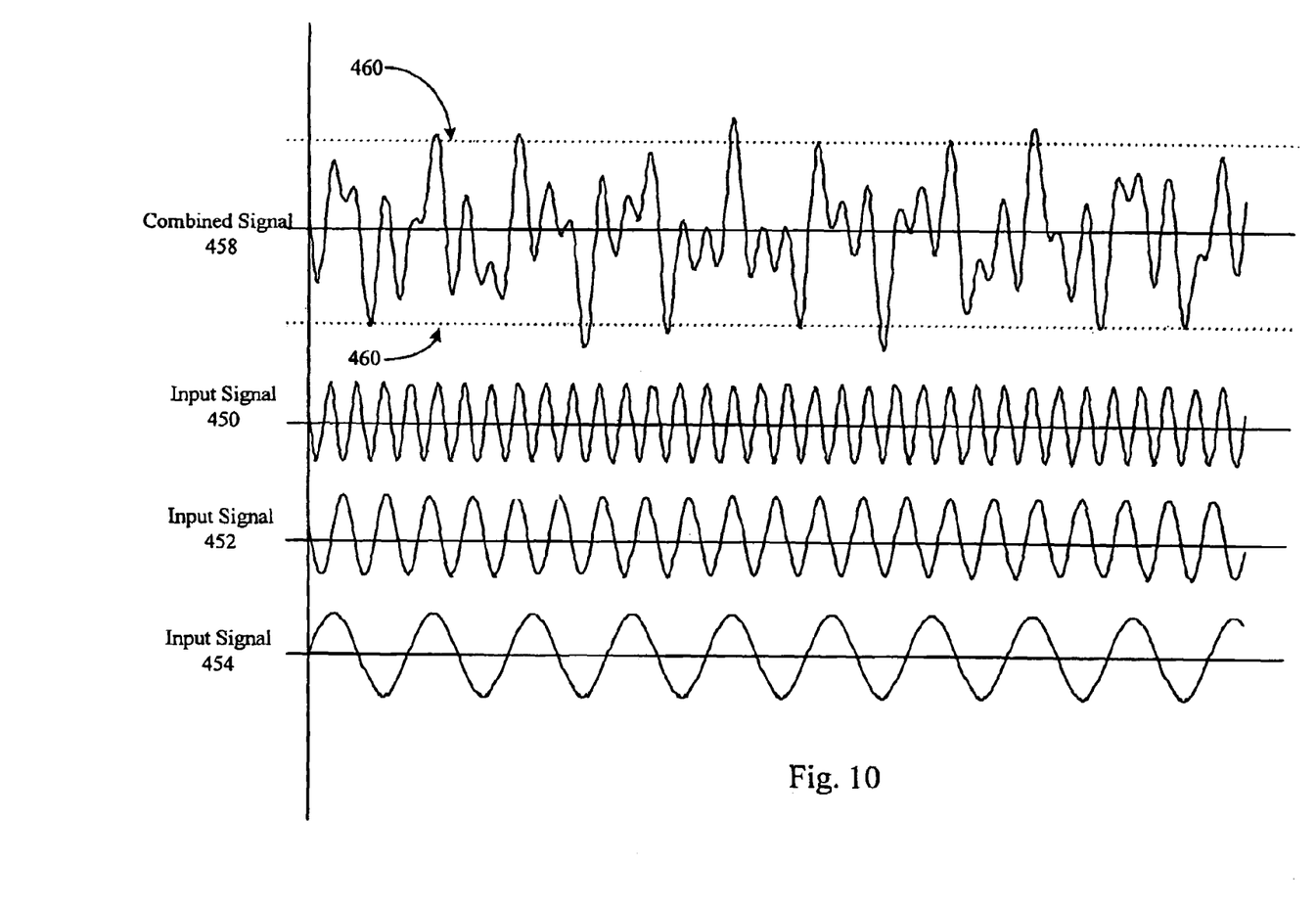
FIG. 10 is an exemplary diagram of a magnified portion of signals shown in FIG. 9 and the combined signal.

The input signals 450–454 are shown at the bottom of FIG. 10 while the combined signals 458 is shown at the top. Because the input signals 450–454 are at different frequencies, the relative phases between the input signals 450–454 change. When the phases of the input signals 450–454 align, the amplitude of the combined signal 458 rises to form a peak, since, for this example, the amplitude of the combined signals 458 is the sum of the input signals 450–454.

The peaks in the combined signals 458 may be detected by using thresholds such as a threshold 460. The threshold 460 may represent an envelope within which the combined signal 458 must be contained in order to guarantee faithful processing by down stream devices such as the power amplifier 214, for example. Thus, if the amplitude of the combined signal 458 exceeds the threshold 460, then the pre-distortion device 400 attenuates select ones of the input signals 450–454 to reduce the amplitude of the combined signal 458 to be less than the threshold 460 (i.e., to within the envelope).

Returning to FIG. 5, the input selection parameter generator 430 may threshold the combined signal received from link 404 and enable the attenuation value generators 418–422 to generate attenuation values. When not enabled, the attenuation value generators 418–422 outputs attenuation values equivalent to no attenuation to all the attenuators 320–324. For example, the attenuation value generators may output 1s for attenuation values when no attenuation is desired and a fraction when attenuation is desired.

When no attenuation is desired, the similarity measurement devices 406–410 may be disabled to conserve processing power. (For analog implementations, the output of the similarity measurement devices may be ignored). If a small percentage of data windows are expected to have peaks in the combined signal, then processing power for the attenuation value generators 418–422 may also be small when compared to the processing power required for processing every window, since processing for the similarity measurement devices 406–410 and the attenuation value generators 418–422 for a small number of data windows may be spread over the window times of a large number of other windows that do not require attenuation.

When attenuation is needed, the similarity measurement devices 406–410 generates a similarity measure between each of the input signals 450–454 and the combined signal. For example, one measure of similarity may be multiplying each bit in the combined signal by a corresponding bit in each of the input signals 450–454 and summing the products.

Other measures of similarity may also be used such as determining a cross-correlation between each of the input signals 450–454 and the second combined signal. A formal definition of cross-correlation is provided on Page 343 of Communication Systems, by Simon Haykin, and the principles described may be applied to generating a similarity measurements.

For example, a dot-product between each of the input signals 450–454 and the second combined signal may be used to generate a "windowed" cross-correlation. As is well known, a cross-correlation between two waveforms is generated by integrating the two waveforms as one waveform is "swept" pass the other waveform. For discrete waveforms, as the case here, the sweeping corresponds to concatenating in time the windows of data corresponding to one of the input signals 450–454 and the second combined signal, and moving one window of data past the other in one sample time increments. The integration corresponds to taking the dot products of any overlapping samples and summing the results. The dot product is the product of the overlapping samples. Alternatively, a windowed dot-product can also be used. A single window of some number of samples could be swept over both the individual signal and the combined signal. The output may be the integral of the product.

The outputs of the similarity measurement devices 406–410 may be compared to a predetermined selection threshold value by the associated attenuation value generator 418–422. Those input signals 450–454 that exceed the predetermined selection threshold may be attenuated by a preset amount so that the combined signal generated by the combiner 208 is guaranteed to be within the desired envelope.

The predetermined selection threshold value may be a function of an average power of the second combined signal, or it could be any arbitrary value. For example, the value could be set at two times the average power.

Instead of using the predetermined selection threshold value discussed above, a predetermined number of the input signals 450–454 that have highest similarity comparison values (outputs of the similarity measurement devices 406–410) may be selected. For example, the outputs of the similarity measurement devices 406–410 may be sorted in descending order, and input signals 450–454 corresponding to the largest N outputs may be selected for attenuation, where N is the predetermined number. The sorting operation may be performed by the controller 432, for example, that receives the outputs of all the similarity measurement devices 406–410 and outputs enable signals only to the attenuation value generators 418–422 corresponding to selected input signals 450–454. Each of the selected N input signals 450–454 may be attenuated by M % where M is the attenuation value expressed as a percentage.

N may be determined statistically or experimentally based on the number of input signals 450–454 that needs to be reduced when a peak occurs to force the combined signal to fit within the desired envelope. For example, if it is determined over a representative period of time that attenuating each of 10 input signals 450–454 by 8% is sufficient to achieve satisfactory performance, then N=10 and M=8%. M may be made different for each of the input signals 450–454. For example, M may be based on the degree of similarity between a particular input signal 450–454 and the second combined signal.

Figure 11:
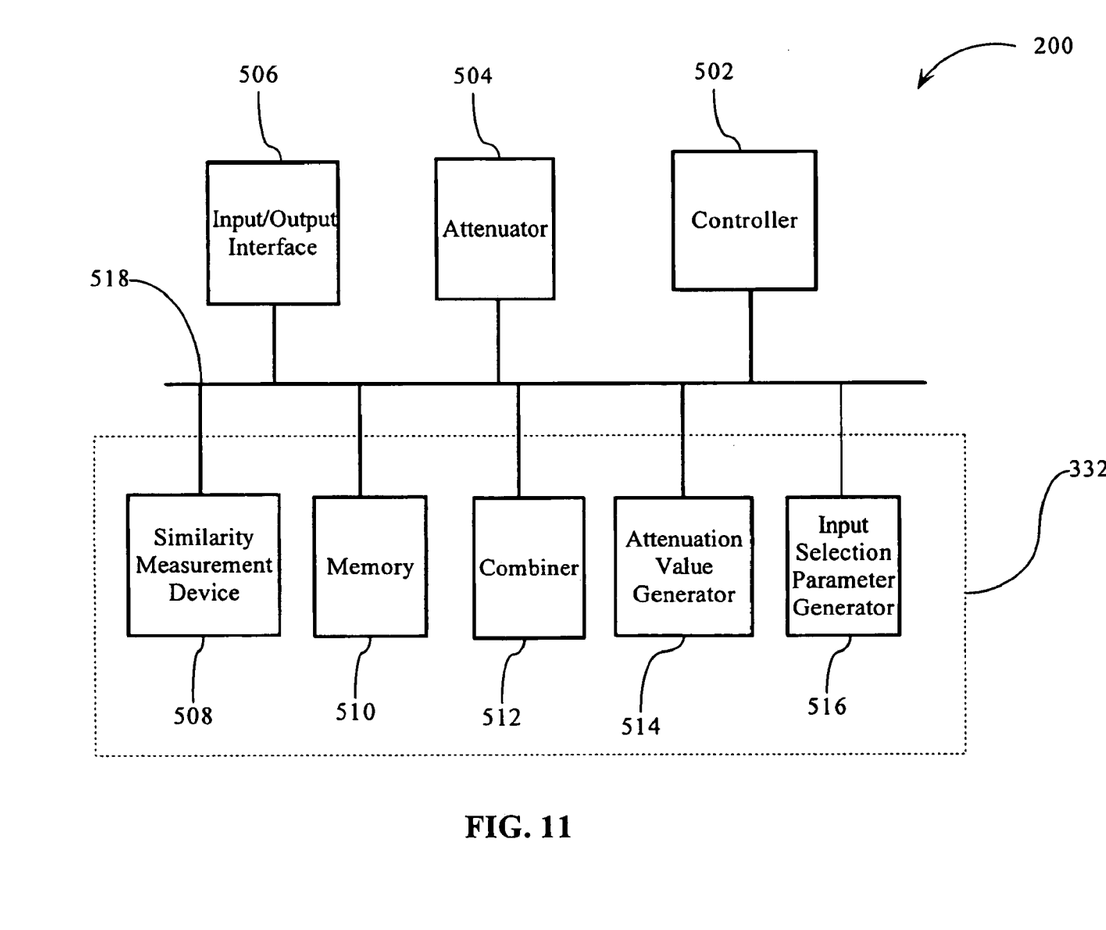
FIG. 11 is an exemplary block diagram of components that implement the pre-distortion device.

FIG. 11 shows an exemplary block diagram of the pre-distortion device 200. The pre-distortion device 200 includes a controller 502, an attenuator 504 that performs the functions of the attenuators 320–324, an input/output interface 506 that may include A/D converters for digitizing the input signals 450–454 and outputting the attenuated input signals to the combiner 208, and the attenuator controller 332. The attenuator controller 332 may include a similarity measurement device 508 that performs the functions of the similarity measurement devices 406–410, a memory 510, a combiner 512, an attenuation value generator 514 that performs the functions of the attenuation value generators 418–422 and an input selection parameter generator 430. The above components are coupled together via a bus 518.

While the above pre-distortion device 200 is described using a bus architecture, any other architecture may be used as is well known in the art. The bus architecture is used for illustration purposes and not intended as a limitation. Also, functions of the attenuation controller 332 and attenuator 504 may be performed by the controller 502 as implementation circumstances dictate. The following description discusses the functions performed by the pre-distortion device 200 in terms of the attenuator 504 and the attenuation controller 332 as an example.

When received by the input/output interface 506, the input signals 450–454 are A/D converted to digital values such as 8 bits per sample and stored in the memory 510. The controller 502 monitors the amount of data that is stored in the memory 510, and when sufficient data is available based on the window size, the controller 502 commands the combiner 512 to combined the data for a next window.

The portion of the memory 510 that receives the input signals 450–454 may be organized as a collection of FIFOs, for example. The combiner 512 may read data points from the FIFOs associated with each of the input signals 450–454 for the same time sample, and combine the read data by summing them to generate a single combined value for that time sample, for example. The combined value may be stored in another portion of the memory 510 and made available for further processing.

When all the combined values for the second combined signal are generated, the input selection parameter generator 516 may threshold the combined signal to determine if any attenuation is required. If not required, then a signal is sent to the attenuation value generator 514 of that fact, which in turn indicates to the attenuator 504 to pass the data for all the input signals 450–454 to the input/output interface 506 without attenuation. Actually, a signal may be sent directly to the input/output interface 506 to read the second combined signal from the memory 510 directly without any involvement of the attenuator 504.

If attenuation is required, then appropriate signals are sent to the similarity measurement device 508 and the attenuation value generator 514 to generate similarity measurements (using any of the above described techniques or their equivalents) and thresholding the results to select those input signals 450–454 that should be attenuated. The threshold may be the predetermined selection threshold or a threshold generated based on a power measurement of the second combined signal as discussed above. Then, attenuation values are generated based on the similarity measurements or based on a predetermined scheme (e.g., attenuate by a predetermined percentage) and output the attenuation values to the attenuator 504 to modify the data of the input signals 450–454 for the corresponding window, and output the attenuated data through the input/output interface 506 to the combiner 208.

Figure 12:
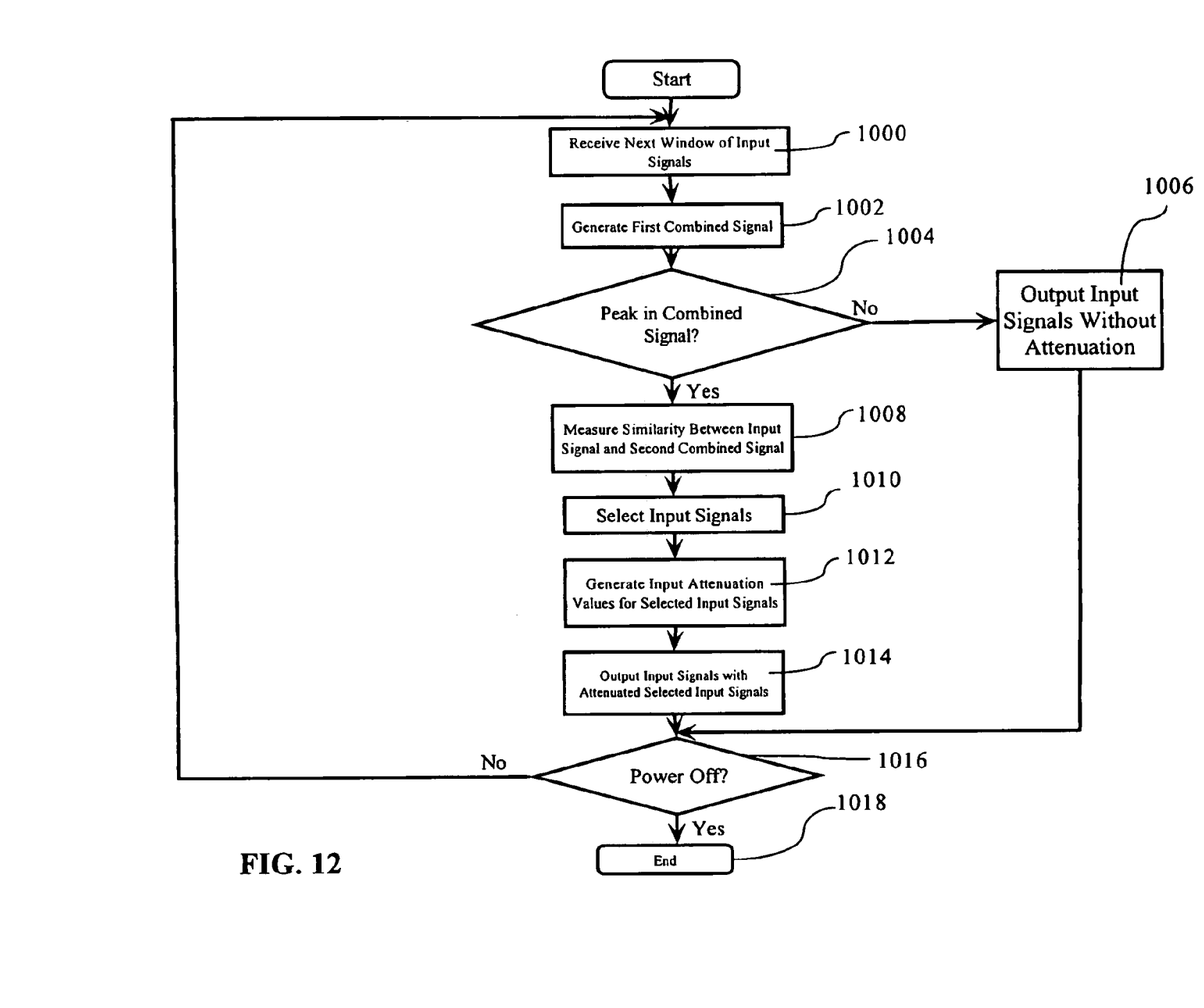
FIG. 12 is an exemplary flow chart of a process of the pre-distortion device.

FIG. 12 shows an exemplary flow chart of the predistortion device 200. In step 1000, a window of data is received for all the input signals 450–454. The received data is converted to digitized data and stored in memory 510, and the process goes to step 1002. While the flow chart shows the receiving data step 1000 in sequential relationship to the other steps, step 1000 may occur concurrently with other steps. The flow chart merely shows the logical sequences that may occur. In step 1002, the combiner 512 generates the second combined signal and stores the second combined signal in the memory 510, and the process goes to step 1004.

In step 1004, the input selection parameter generator thresholds the second combined signal to determine if input signals attenuation is required. If required, the process goes to step 1008, otherwise, the process goes to step 1006. In step 1006, data for the input signals are output to the combiner 208 via the input/output interface 508, and the process goes to step 1016.

In step 1008, the similarity measurement device 518 generates similarity measurements for the input signals 450–454, and the process goes to step 1010. In step 1010, the attenuator controller 514 thresholds the similarity measurements, selects the input signals that should be attenuated, and the process goes to step 1012. In step 1012, the attenuator controller 514 generates the attenuation values, and the process goes to step 1014. In step 1014, the selected input signals are attenuated and output to the combiner 208 via the input/output interface 508, and the process goes to step 1016.

In step 1016, the process determines power is to be turned off. If power is to be turned off, the process goes to step 1018 and ends; otherwise, the process returns to step 1000 and begins the next cycle.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A method for generating a constant envelope combined signal in a communications system, comprising:

generating a combined signal in a communications system that is a combination of a plurality of input signals;

generating a similarity measurement between each of the input signals and the combined signal by multiplying sample values of each of the input signals with corresponding values of the combined signal to generate products, and summing the products to form the similarity measurement;

selecting ones of the input signals for attenuation based on the similarity measurement;

attenuating amplitudes of the selected ones of the input signals to generate attenuated input signals;

combining the attenuated input signals and other non-attenuated ones of the input signals to generate a constant envelope combined signal; and outputting the constant envelope combined signal.

2. A method for generating a constant envelope combined signal in a communications system, comprising:

generating a combined signal in a communications system that is a combination of a plurality of input signals;

generating a similarity measurement between each of the input signals and the combined signal by cross-correlating each of the input signals with the combined signal, cross-correlating each of the input signals further comprising sweeping one of each of the input signals and the combined signal past each other, and generating a dot product for each sweep increment between overlapping portions of each of the input signals and the combined signal;

selecting ones of the input signals for attenuation based on the similarity measurement;

attenuating amplitudes of the selected ones of the input signals to generate attenuated input signals;

combining the attenuated input signals and other non-attenuated ones of the input signals to generate a constant envelope combined signal; and outputting the constant envelope combined signal.

3. A method for generating a constant envelope combined signal in a communications system, comprising:

generating a combined signal in a communications system that is a combination of a plurality of input signals;

generating a similarity measurement between each of the input signals and the combined signal;

selecting ones of the input signals for attenuation based on the similarity measurement by comparing the similarity measurements with each other, and selecting N number of input signals that correspond to N largest similarity measurements, where N is a positive integer;

attenuating amplitudes of the selected ones of the input signals to generate attenuated input signals;

combining the attenuated input signals and other non-attenuated ones of the input signals to generate a constant envelope combined signal; and outputting the constant envelope combined signal.

4. The method of claim 3, further comprising determining a value for N by empirical analysis of combined signals.

5. An apparatus that outputs a constant envelope combined signal in a communications system, comprising:
- a controller that controls generating of a combined signal in a communications system that is a combination of a plurality of input signals, and attenuating of amplitudes of selected ones of the input signals to generate attenuated input signals, the controller comprising:
  - a similarity measurement device that generates a similarity measurement between each of the input signals and the combined signal, and
  - an attenuation value generator that selects ones of the input signals based on the similarity measurement; and
- a memory coupled to the controller,
- wherein the similarity measurement device generates the similarity measurement by multiplying sample values of each of the input signals with corresponding values of the combined signal to generate products, and summing the products to form the similarity measurement, and
- the attenuated input signals and other non-attenuated ones of the input signals may be combined to form for output a constant envelope combined signal.

6. An apparatus that outputs a constant envelope combined signal in a communications system, comprising:
- a controller that controls generating of a combined signal in a communications system that is a combination of a plurality of input signals, and attenuating of amplitudes of selected ones of the input signals to generate attenuated input signals, the controller comprising:
  - a similarity measurement device that generates a similarity measurement between each of the input signals and the combined signal, and
  - an attenuation value generator that selects ones of the input signals based on the similarity measurement; and
- a memory coupled to the controller,
- wherein the similarity measurement device generates the similarity measurement by cross-correlating each of the input signals with the combined signal, the cross-correlating comprising sweeping one of each of the input signals and the combined signal past other, and
- generating a dot product for each sweep increment between overlapping portions of each of the input signals and the combined signal, and
- the attenuated input signals and other non-attenuated ones of the input signals may be combined to form for output a constant envelope combined signal.

7. An apparatus that outputs a constant envelope combined signal in a communications system, comprising:
- a controller that controls generating of a combined signal in a communications system that is a combination of a plurality of input signals, and attenuating of amplitudes of selected ones of the input signals to generate attenuated input signals, the controller comprising:
  - a similarity measurement device that generates a similarity measurement between each of the input signals and the combined signal, and
  - an attenuation value generator that selects ones of the input signals based on the similarity measurement; and
- a memory coupled to the controller,
- wherein the attenuation value generator selects the ones of the input signals
- by comparing the similarity measurements with each other, and
- selecting N number of input signals that correspond to N largest similarity measurements, where N is a positive integer, and
- the attenuated input signals and other non-attenuated ones of the input signals may be combined to form for output a constant envelope combined signal.

8. The apparatus of claim 7, wherein a value for N is determined by empirical analysis of combined signals.

* * * * *